(12) United States Patent
Metcalf

(10) Patent No.: US 11,561,874 B2
(45) Date of Patent: Jan. 24, 2023

(54) RESERVE BUS DISTRIBUTION SYSTEM TESTING

(71) Applicant: Equinix, Inc., Redwood City, CA (US)

(72) Inventor: Gregory Metcalf, San Francisco, CA (US)

(73) Assignee: EQUINIX, INC., Redwood City, CA (US)

( * ) Notice: Subject to any disclaimer, the term of this patent is extended or adjusted under 35 U.S.C. 154(b) by 188 days.

(21) Appl. No.: 17/105,441

(22) Filed: Nov. 25, 2020

(65) Prior Publication Data
US 2021/0157697 A1 May 27, 2021

Related U.S. Application Data

(60) Provisional application No. 62/941,510, filed on Nov. 27, 2019.

(51) Int. Cl.
| | |
|---|---|
| *G06F 11/22* | (2006.01) |
| *G06F 1/28* | (2006.01) |
| *G06F 1/30* | (2006.01) |
| *G06F 13/36* | (2006.01) |

(Continued)

(52) U.S. Cl.
CPC ............ *G06F 11/2273* (2013.01); *G06F 1/28* (2013.01); *G06F 1/30* (2013.01); *G06F 13/36* (2013.01); *H02J 3/001* (2020.01); *H02J 9/06* (2013.01); *H02J 2203/20* (2020.01)

(58) Field of Classification Search
CPC .......... G06F 11/2273; G06F 1/28; G06F 1/30; G06F 13/36; H02J 3/001; H02J 9/06; H02J 2203/20; G01R 31/40; G01R 31/00
See application file for complete search history.

(56) References Cited

U.S. PATENT DOCUMENTS

| | | | |
|---|---|---|---|
| 5,458,991 | A | 10/1995 | Severinsky |
| 9,429,599 | B1 | 8/2016 | Contario et al. |
| 10,031,570 | B2 | 7/2018 | Morales et al. |

(Continued)

FOREIGN PATENT DOCUMENTS

| | | |
|---|---|---|
| CN | 106526498 A | 3/2014 |
| CN | 108700922 A | 10/2018 |
| EP | 3400498 A1 | 11/2018 |

OTHER PUBLICATIONS

International Search Report and Written Opinion of International Application No. PCT/US2020/062432, dated Mar. 1, 2021, 14 pp.

(Continued)

*Primary Examiner* — Toan T Vu
*Assistant Examiner* — Thai H Tran
(74) *Attorney, Agent, or Firm* — Shumaker & Sieffert, P.A.

(57) ABSTRACT

A method of testing a distribution center bus system having one or more of the following features: (a) opening a reserve bus breaker between a reserve bus UPS and a reserve bus, (b) initiating a self-test mode at the reserve bus UPS, (c) routing current through the reserve bus UPS, the reserve bus, a reserve bus static bypass circuit back to the reserve bus UPS, (d) testing the reserve bus to detect heat, determine any significant current loss, or identify other attributes suggesting failure, (e) identifying if a primary bus static transfer switch has tripped over to the reserve bus, and (f) terminating the self-test at the reserve bus UPS if the primary bus static transfer switch has tripped.

7 Claims, 4 Drawing Sheets

(51) Int. Cl.
*H02J 3/00* (2006.01)
*H02J 9/06* (2006.01)

(56) References Cited

U.S. PATENT DOCUMENTS

| | | | |
|---|---|---|---|
| 10,404,523 | B2 | 9/2019 | Cencini et al. |
| 2005/0200205 | A1* | 9/2005 | Winn .................. H02J 9/08 307/64 |
| 2005/0286274 | A1* | 12/2005 | Pfitzer ................. G01R 31/40 363/37 |
| 2009/0033154 | A1* | 2/2009 | Linkhart ............... H02J 9/06 307/65 |
| 2012/0066519 | A1 | 3/2012 | El-Essawy et al. |
| 2013/0080793 | A1 | 3/2013 | Familiant et al. |
| 2013/0342012 | A1 | 12/2013 | Seaton et al. |

OTHER PUBLICATIONS

"APC Smart-Ups VT, w/Parallel Operation," Guide Specifications for 10kVA-30kVA 3x208/208-120 Solution Uninterruptible Power System Retrieved Sep. 9, 2019 from: https://m.markertek.com/Attachments/Specifications/APC/SUVTP20KF4B4S-Specifications.pdf, 16 pp.
International Preliminary Report on Patentability from International Application No. PCT/US2020/062432, dated Jun. 9, 2022, 10 pp.
Examination Report No. 1 from counterpart Australian Application No. 2020393924 dated Oct. 20, 2022, 3 pp.

* cited by examiner

RESERVE BUS DISTRIBUTION SYSTEM TESTING

CROSS REFERENCE

This application claims the benefit of U.S. Provisional Patent Application No. 62/941,510, filed on Nov. 27, 2019, which is hereby incorporated by reference herein in its entirety.

TECHNICAL FIELD

The present disclosure relates to power distribution, and in particular, testing a bus in a power distribution system in a data center.

BACKGROUND

A data center is a building, dedicated space within a building, or a group of buildings used to house computer systems and associated components, such as telecommunications and storage systems.

Since IT operations are crucial for business continuity, a data center generally includes redundant or backup components and infrastructure for power supply, data communications connections, environmental controls (e.g., air conditioning, fire suppression), and various security devices. A large data center may be an industrial-scale operation using a significant amount of electricity.

SUMMARY

This disclosure describes a method of testing a bus system that may be located in a distribution center in accordance with aspects of the present disclosure. In some examples, such a bus system may include one or more of the following features: (a) at least one primary block configured to provide power to at least one load, wherein the at least one primary block may have one or more of the following features: (i) a primary power source; and (ii) a primary UPS configured with a static transfer switch ("STS") which switches to a reserve power source should the primary power source fail or become unconditioned, (b) a reserve block configured to serve as a reserve power source to the at least one primary block, wherein the reserve block may have one or more of the following features: (i) a reserve power source, (ii) a reserve UPS having a static bypass circuit, wherein the reserve UPS is capable of cycling current through the static bypass circuit without disconnecting the UPS from the reserve power source, and (iii) a reserve bus capable of connecting the at least one primary block to the reserve block.

In some examples, such a method may include one or more of the following acts: (a) opening a reserve bus breaker between the reserve UPS and the reserve bus, (b) routing current through the reserve bus, (c) initiating a self-test mode at the reserve UPS, (c) routing current in the reserve block back through the static bypass circuit, through the reserve UPS and back through the reserve bus to test the integrity of the reserve bus, (d) determining, by the reserve UPS, whether the at least one primary block has switched to the reserve power source, (e) terminating the self-test mode at the reserve UPS if the at least one primary block has switched to the reserve power source, (f) monitoring, by the reserve UPS, the current in the reserve bus to determine any current loss, (g) monitoring the reserve bus to locate any excessive heat within the reserve bus, (h) terminating the self-test mode at the reserve UPS, and (i) closing the reserve bus breaker.

In another example, this disclosure also describes a method of testing a distribution center bus system that may have one or more of the following features: (a) opening a reserve block breaker between a reserve block UPS and a reserve bus, (b) initiating a self-test mode at the reserve block UPS, (c) routing current through the reserve block UPS, the reserve bus, a reserve block static bypass circuit back to the reserve block UPS, (d) testing the reserve block to determine any current loss, (e) identifying if a primary block static transfer switch has tripped over to the reserve block, and (f) terminating the self-test at the reserve block UPS if the primary block static transfer switch has tripped.

In another example, this disclosure describes a distribution center reserve block testing circuit having one of more of the following features: (a) a power source, (b) a UPS operably coupled to the power source, (c) a static bypass circuit operably coupled to an inverter of the reserve block UPS to allow current to run through the reserve bus during a self-test of the reserve block UPS, (d) a static transfer switch coupled with the reserve block and with at least one primary block of the distribution center.

BRIEF DESCRIPTION OF THE DRAWINGS

The present disclosure may become more fully understood from the detailed description given hereinbelow and the accompanying drawings which are provided for illustration, and thus, do not limit the present disclosure.

DETAILED DESCRIPTION

Figure 1:
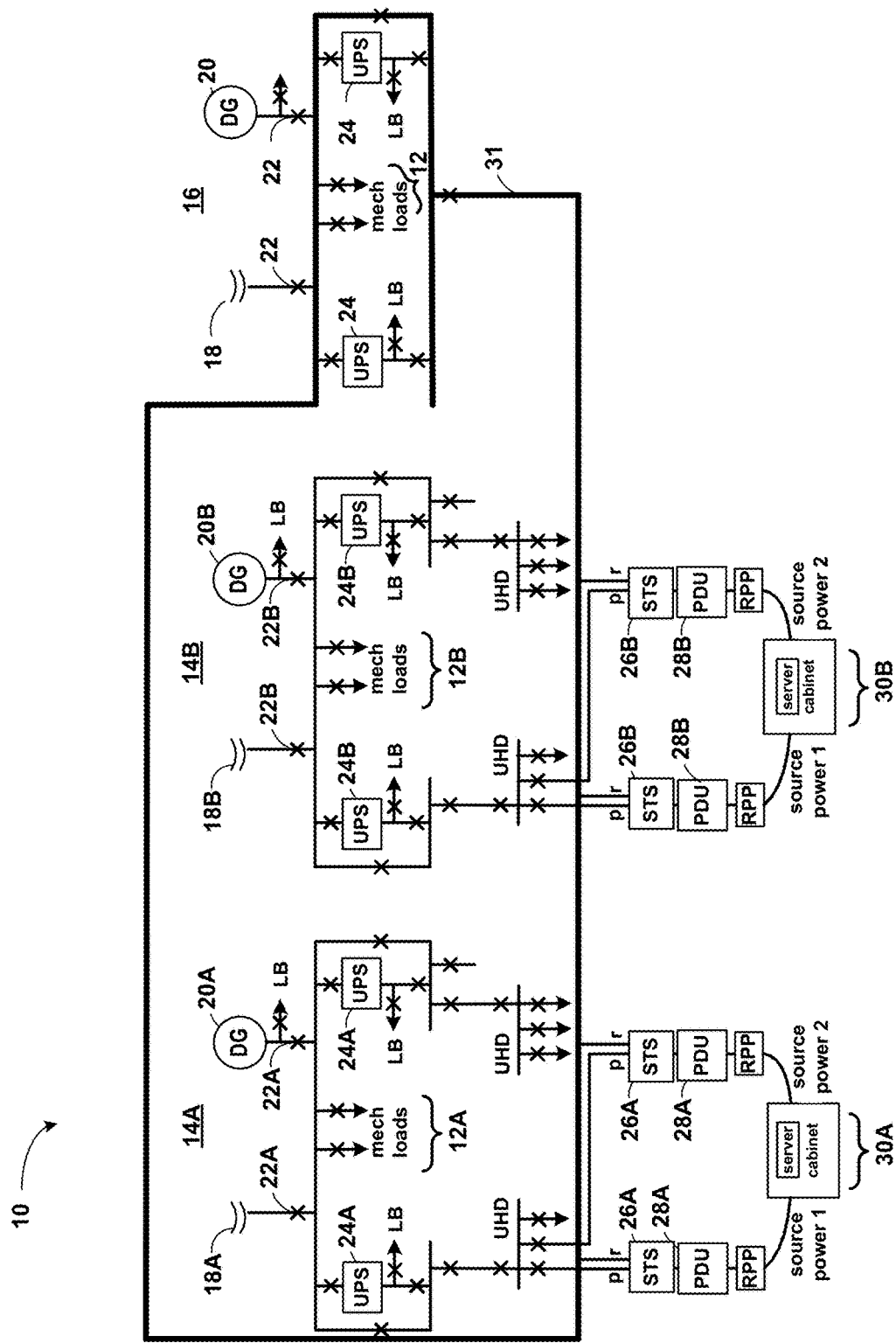
FIG. 1 schematically shows a data center with multiple primary blocks and a reserve block.

The following discussion is presented to enable a person skilled in the art to make and use of one or more aspects of the present disclosure. Various modifications to the illustrated examples may be clear to those skilled in the art, and the generic principles herein may, in some cases, be applied to other fields, examples, and applications without departing from the present disclosure. Thus, the present disclosure is not intended to be limited to the examples shown but is to be accorded the widest scope consistent with the principles and features disclosed herein. The following detailed description is to be read with reference to the figures, in which like elements in different figures are intended to have like reference numerals. The figures, which are not necessarily to scale, depict selected examples and are not intended to limit the scope of the present disclosure. The examples provided herein have many useful alternatives and fall within the scope of the present disclosure. While examples described herein may be discussed in terms of testing reserve buses, it is contemplated that aspects of the present disclosure may apply in other situations without departing from the spirit of the disclosure.

Backup power typically consists of one or more uninterruptible power supplies (UPS), battery banks, and/or diesel gas turbine generators. A UPS is an electrical apparatus providing emergency power to a load when the input power source or mains power fails. A UPS differs from an auxiliary or emergency power system or standby generator in that it will provide near-instantaneous protection from input power interruptions by supplying energy stored in batteries, super-capacitors, or flywheels. The on-battery run-time of most UPS is relatively short (only a few minutes, in some cases) but enough to start a standby power source or properly shut down the protected equipment. It is a type of continual power system.

A UPS is typically used to supply power to hardware such as computers, data centers, telecommunication equipment or other electrical equipment where an unexpected power disruption could result in business disruption or data loss. UPS units range in size from units designed to protect a single computer without a video monitor (around 200-volt-ampere rating) to large units powering entire data centers or buildings.

To prevent single points of failure, all elements of the electrical systems, including backup systems, are typically fully duplicated, and critical systems may be connected to both the "primary" and "reserve" power feeds. This arrangement is often made to achieve N+1 redundancy in the systems. Static transfer switches are sometimes used to ensure fast or near-instantaneous switchover from one supply to the other in the event of a power failure. A static transfer switch uses power semiconductors such as silicon-controlled rectifiers (SCRs) to transfer a load between two sources. Because there are no mechanical moving parts, the transfer can be completed rapidly, perhaps within a quarter-cycle of the power frequency. Static transfer switches can be used where reliable and independent sources of power are available, and where it may be necessary to protect the load from interruptions, or from any surges or sags in the prime power source (referred herein as being unconditioned).

In some cases, a data center may distribute the reserve UPS bus to each of the primary bus STSs "as-a-service" via busduct (US) or busbar (EMEA/AP) or cable bus, rather than direct radially feeding each primary bus STSs from the reserve bus. Because the reserve bus distribution is common to all the primary buses, it may be desirable that it be tested. One way to perform such a test is currently by using an end of line tap box for connecting to a load bank. A load bank may be a device which develops an electrical load, applies the load to an electrical power source and converts or dissipates the resultant power output of the source. A load bank may include load elements with protection, control, metering and accessory devices required for operation. Load banks can either be permanently installed at a facility and permanently connected to a power source or portable versions can be used for testing power sources such as standby generators and batteries. Load banks may effectively replicate, prove and verify the real-life demands on critical power systems.

Testing a reserve bus through a such a procedure exposes the data center to, at least temporarily, a lack of redundancy. For example, if a reserve bus is undergoing a 100% load bank test, and if a primary bus were to fail and the STSs switch over to the reserve bus while the test is being conducted, the transferred load would overload the reserve bus. Since the reserve bus would already be undergoing a 100% load bank test, it would not be able to accept any additional load. Effectively, therefore, during such a test procedure, use of the reserve bus is lost. This situation puts any customer relying on the data center at risk.

FIG. 1 schematically shows a data center with multiple primary blocks and a reserve block, in accordance with one or more aspects of the present disclosure. Data center 10 may be, in some examples, a physical facility housing critical applications and data. A data center's design may be based on a network of computing and storage resources (e.g., mechanical loads 12) enabling the delivery of shared applications and data. In the example of FIG. 1, data center 10 may be split into primary blocks 14A and 14B and a reserve block 16. In some cases, the reserve block 16 may be a mirror of the primary block 14A and 14B, meaning the structure of the blocks 14A, 14B and 16 are almost identical, and meaning the reserve block 16 could support all the mechanical loads 12 and customer cabinets 30A and 30B on any of the primary blocks 14A and 14B. While FIG. 1 is shown with two primary blocks, 14A and 14B, reserve block 16 can support many more primary blocks beyond 14A and 14B. In some cases, one reserve block may support anywhere from one to eight or more blocks in a data center 10.

As shown in FIG. 1, in one example, primary blocks 14A and 14B and reserve block 16 can include inputs from one or more utilities 18, 18A and 18B, one or more generators 20, 20A and 20B, and a primary switch 22, 22A and 22B between the one or more utilities 18, 18A and 18B and the one or more generators 20, 20A and 20B. As depicted in FIG. 1, current flows to UPSs 24, 24A and 24B, and to static transfer switches 26, 26A and 26B. Current may flow to electrical panels within one or more power distribution units (PDU) 28A and 28B, providing power to circuits to which customer cabinets 30A and 30B are connected.

In the example of FIG. 1, STSs 26A and 26B are automatic static transfer switches designed to transfer electric loads between two AC power sources (e.g., between 18A and 18 or between 18B and 18) without little or no interruption in power continuity. Static transfer switches 26, 26A and 26B may each be an electrical device allowing near- or seemingly near-instantaneous transfer of power sources to loads 30A and 30B. This switching time means if one power source fails (e.g., 18A or 18B), the STS 26A or 26B switches to the back-up power source 18 quickly so the load(s) 30A or 30B may be powered without interruption.

STSs 26A and 26B may use solid-state power electronics or "static" switching. In some examples, STSs 26A and 26B may consist of three major parts: controls and metering, silicon-controlled rectifiers, and a breaker bus assembly. STS 26A and 26B monitor two power sources 18A and 18B and each may be configured to automatically shift to the reserve power source 18 on sensing a failure, degradation or un-conditioning of either source 18A or 18B.

Use of reserve block 16, in accordance with one or more techniques described herein, may provide possible benefits, technical advantages, and/or solve problems. For instance, reserve block 16 distribution is designed to loop, through bus 31, around the building to serve all the primary blocks 14A, 14B. With a modification to the switchgear by splitting the static bypass from the inverter output of UPS 24 with a bus-section 31, reserve block 16 can take advantage of a "self-test" mode of UPS operation already provided as part of the UPS 24.

The "self-test" mode typically comes standard on most UPSs. Some examples in this disclosure use this built in functionality to feed current through reserve block 16 through bus 31 additionally rather than through just the UPS itself. The self-test mode works by closing, with the inverter on with no load, the static bypass in parallel with the inverter to feed current in a run-around loop back to the rectifier input (discussed in greater detail below). The rectifier/inverter is controlled by the UPS to ramp up to 100% of rated output where the current is fed around in this closed loop. Reserve bus 31 may be tested by causing the reserve block 16 to extend the closed loop around distribution loop 31 through the building 10 by opening the normally closed bus section 31 and enabling the current to flow back to the static bypass and back into the rectifier in this "self-test" mode.

Utilizing the UPS "self-test" mode assists in avoiding reserve block unavailability during 100% load testing with load bank. In some examples, UPS 24 can sense, during the self-test mode, an overload (i.e., caused by a failover load) and terminate the test so that it can supply power to any STSs 26A, 26B that have transferred to the reserve bus 31. Such a UPS self-test mode thus allows "on-demand" 100% load testing of reserve bus 31 to identify any hotspots indicating a problem with the reserve bus 31. Such a test can be performed without connecting an actual 100% rated load bank and without burning significant kWh (kilowatt hours) energy costs testing the reserve bus 31, since in the self-test mode, only the reserve bus 31 $I^2R$ (impedance) kWh losses and UPS load kWh losses will be incurred. This allows the reserve bus 31 to be tested with very little or no downtime, preventing or alleviating risks of the reserve block 16 not being available.

Figure 2:
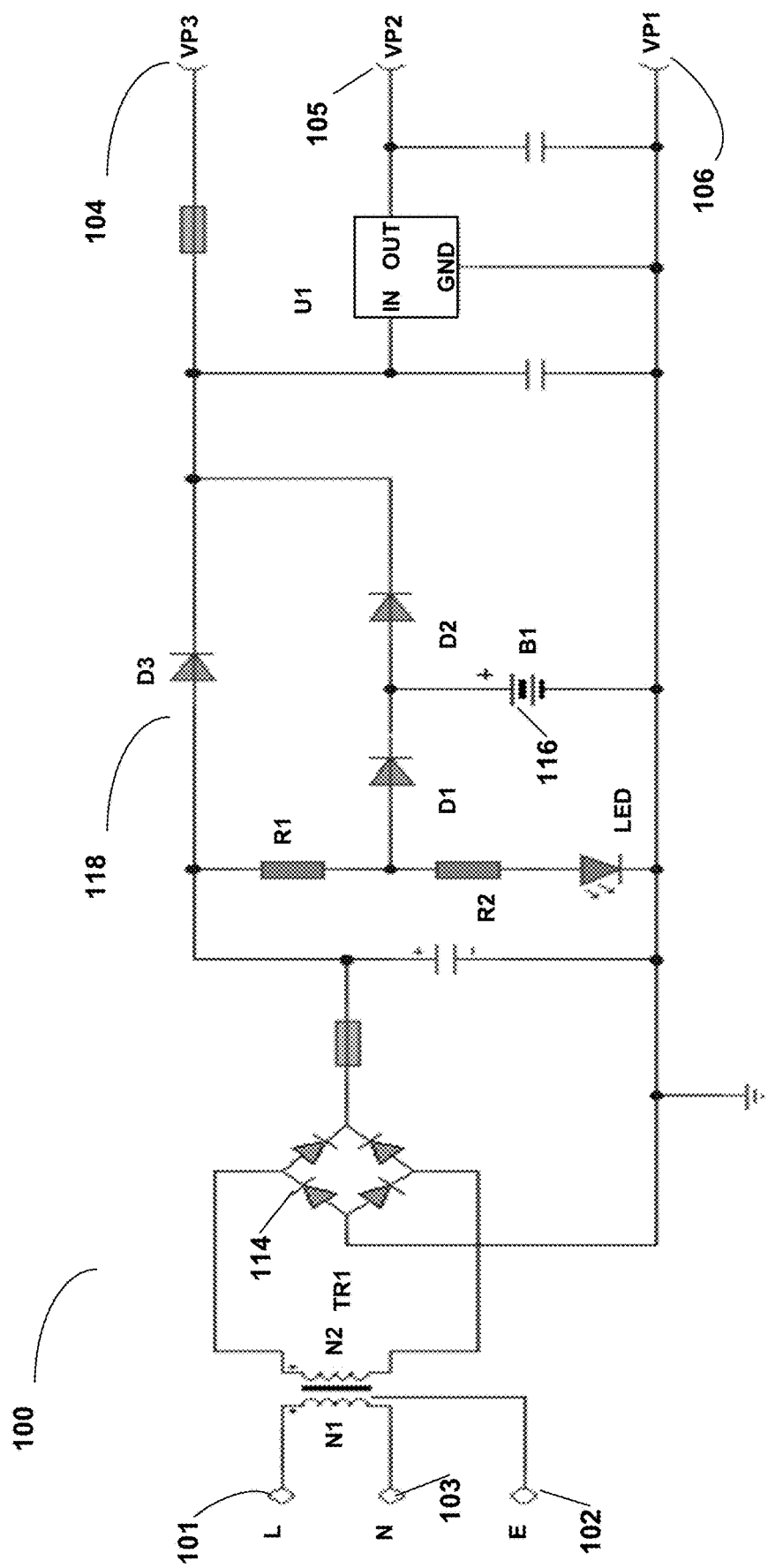
FIG. 2 schematically shows a UPS with a self-test circuit.

FIG. 2 schematically shows a UPS with a self-test circuit, in accordance with one or more aspects of the present disclosure. In FIG. 2, a UPS 100 can include a pair of input terminals 101, 102 and ground 103 and a pair of output terminals 104, 105 and ground 106. The input terminals 101, 102 serve the purpose of connecting the UPS 100 to a utility power source and the output terminals 103, 104 are provided for connecting the UPS 100 to a load. A bi-directional AC to DC power converter 114, connected to load terminals 104, 105 on the AC side and to a battery 116 on the DC side, also charges the battery 116.

Occasionally, UPS 100 may perform a self-test for any of several reasons. Such a self-test may, for example, test the UPS's ability to convert AC to DC and/or charge battery 116, thereby helping to ensure that UPS 100 is capable of serving as a short-term power supply, using battery 116, until a generator or alternative power source is online to provide a reliable alternative source of power. A self-test may also test the battery 116 and its ability to hold a charge. A poorly operating or ineffective battery 116 might not adequately serve as alternative power source in the event of any loss of the primary power source.

In operation, AC power is converted to DC and then stored in battery 116. In the event of a loss of power or in the event of unreliable or unconditioned power, a control system (not specifically shown in FIG. 2) associated with UPS 100 may open a relay (not shown). Loads coupled to UPS 100 may be provided power, short-term, by battery 116 routing DC power through inverter 118, converting DC to AC, and out through terminals 104 and 105.

During a self-test of UPS 100, DC power is converted to AC, but terminals 104 and 105 are not typically coupled to a load. AC flows around the circuit back to converter 114, where it is once again converted back to DC and stored in the battery. During such a self-test, UPS 100 may test various aspects of the UPS, such as battery levels, charging efficiency, AC to DC conversion and DC to AC conversion. The description provided herein is a simplified discussion of the UPS self-test paradigm and self-tests in various UPSs can take on many different forms.

Figure 3:
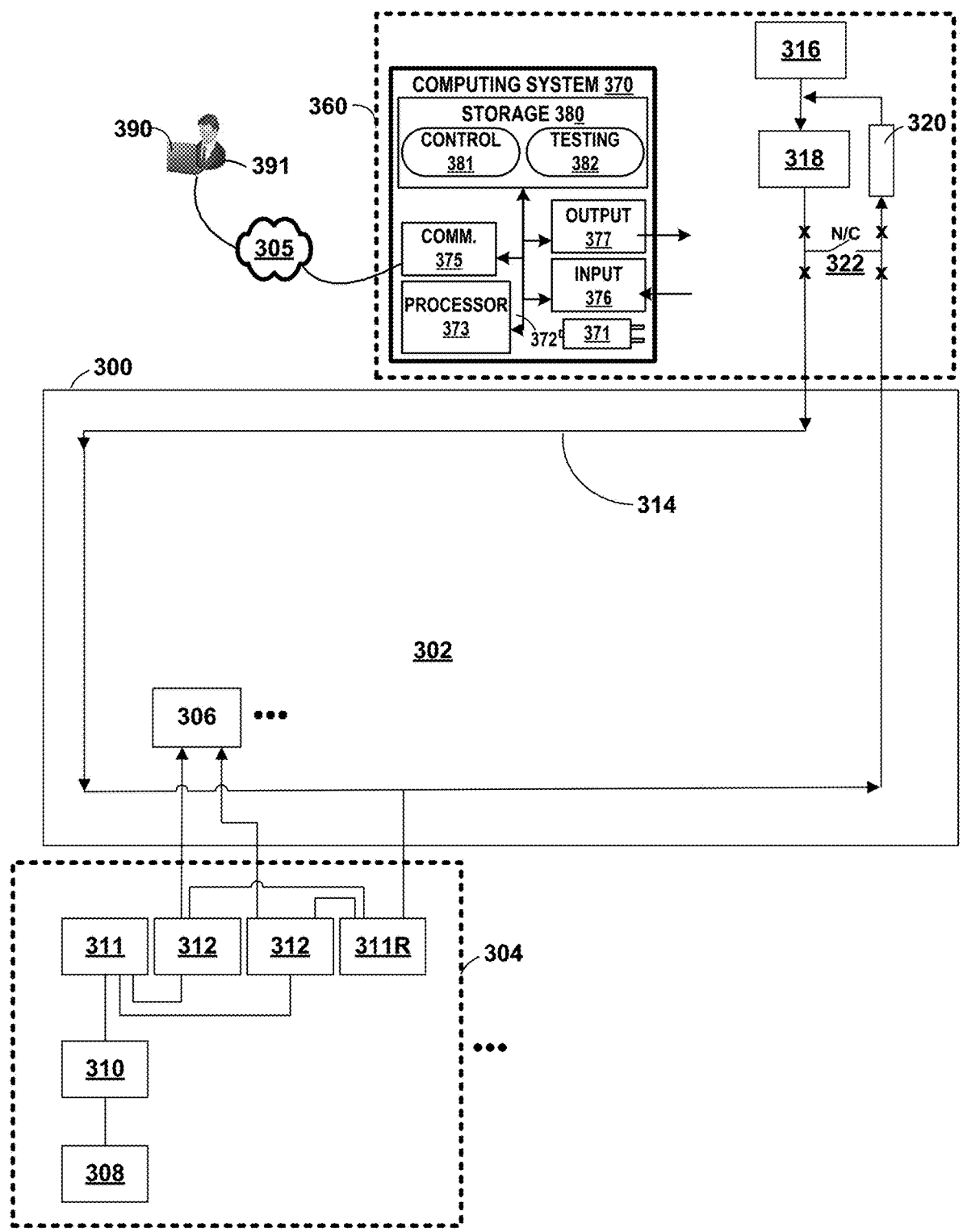
FIG. 3 schematically shows a data center reserve bus.

FIG. 3 is a block diagram of a data center reserve bus system in accordance with one or more aspects of the present disclosure. FIG. 3 includes datacenter building or distribution center 302, primary block 304, reserve block 360, and network 305. Reserve block 360 includes reserve power source 316, computing system 370, reserve UPS 318, static bypass circuit 320, switch 322. Computing system 370 may, in some examples, correspond to the previously described control system of FIG. 2 associated with UPS 100.

Network 305 may connect a number of systems and devices, including reserve block 360 to client computing device 390 (which may be operated by administrator 391). Network 305 may be the internet or may include or represent any public or private communications network or other network. For instance, network 305 may be a cellular, Wi-Fi®, ZigBee, Bluetooth, Near-Field Communication (NFC), satellite, enterprise, service provider, and/or other type of network enabling transfer of transmitting data between computing systems, servers, and computing devices. One or more of client devices, server devices, or other devices may transmit and receive data, commands, control signals, and/or other information across network 305 using any suitable communication techniques. Network 305 may include one or more network hubs, network switches, network routers, satellite dishes, or any other network equipment. Such devices or components may be operatively inter-coupled, thereby providing for the exchange of information between computers, devices, or other components (e.g., between one or more client devices or systems and one or more server devices or systems). Each of the devices or systems illustrated in FIG. 3 may be operatively coupled to network 305 using one or more network links. The links coupling such devices or systems to network 305 may be Ethernet, Asynchronous Transfer Mode (ATM) or other types of network connections, and such connections may be wireless and/or wired connections. One or more of the devices or systems illustrated in FIG. 3 or otherwise on network 305 may be in a remote location relative to one or more other illustrated devices or systems.

Computing system 370, included within reserve block 360, may be implemented as any suitable computing system, such as one or more server computers, workstations, appliances, cloud computing systems, and/or other computing systems that may be capable of performing operations and/or functions described in accordance with one or more aspects of the present disclosure. In some examples, computing system 370 represents a cloud computing system, server farm, and/or server cluster (or portion thereof) that provides services to client devices and other devices or systems. In other examples, computing system 370 may represent or be implemented through one or more virtualized compute instances (e.g., virtual machines, containers) of a data center, cloud computing system, server farm, and/or server cluster.

In FIG. 3, distribution center 302 is illustrated with primary block 304, but any number of primary block(s) 304 may be included in FIG. 3. In such an example, each primary block may be configured to provide power to one or more load(s) 306. In the example shown, primary block 304 may have a primary power source 308 and a primary UPS 310 configured to connect with one or more static transfer switches 312 through switch gear 311 and/or 311R. Switch gear 311 connects power source 308 and UPS 310 to static transfer switches 312, and switch gear 311R connects power source 316 and UPS 318 (from reserve block 360) to static transfer switches 312 (through reserve bus 314). In some examples, switch gear 311 and 311R may be a power distribution unit, switchboard, or other logic that enables UPS-backed high voltage distribution of power to one or more loads 306. Switch gear 311 and 311R may, in some examples, correspond to power distribution units 28 of FIG. 1. Each of static transfer switches 312 switch to a reserve power source (e.g., through reserve bus 314) should the primary power source 308 become unavailable and/or unconditioned. Unconditioned is defined herein as a power loss or an abnormality in the power quality being delivered to a system. Such abnormalities can include low power factor, voltage variations, frequency variations, and surges. In general, electrical systems are based on a supply of power at a certain voltage and frequency. Equipment and electronic devices are chosen based on this expected supply of power.

As described herein, reserve block 360 may serve as a reserve power source to the primary block 304. The reserve bus 314 may have a reserve power source 316 and a reserve UPS 318 having a static bypass circuit 320. The reserve UPS 318 is, in the example shown, capable of cycling current through the static bypass circuit 320 without disconnecting the UPS 318 from the reserve power source 316. Typically, this is done as a UPS self-test mode of operation. In FIG. 3, for example, reserve bus 314 can connect the primary block 304 to the reserve power source 316 through reserve block 360. The UPS self-test process to test reserve bus 314 can be thought of as a "regenerating self-test" where current is generated by the inverter 118 (see, e.g., FIG. 2), outputted to the reserve bus 314, run all the way around the reserve bus 314, run back into the static bypass 320 (e.g., in reverse to the normal "forward" bypass operation) and regenerated by the rectifier 114. As described herein, the reserve bus 314 can be tested, which may include load banking, without putting the data center 302 at risk of failure should a primary block 304 fail and need to shift loads 306 to reserve bus 314 while the reserve bus is load banked at 100%. Testing of the reserve bus 314 can be performed at up to 100% of its rating (e.g. 3000 Amps).

In the example of FIG. 3, computing system 370 may include power source 371, one or more processors 373, one or more communication units 375, one or more input devices 377, one or more output devices 378, and one or more storage devices 380. Storage devices 380 may include control module 381 and testing module 382. One or more of the devices, modules, storage areas, or other components of computing system 370 may be interconnected to enable inter-component communications (physically, communicatively, and/or operatively). In some examples, such connectivity may be provided by through communication channels (e.g., communication channels 372), a system bus, a network connection, an inter-process communication data structure, or any other method for communicating data.

Power source 371 may provide power to one or more components of computing system 370. Power source 371 may receive power from the primary alternating current (AC) power supply in a building (e.g., distribution center 302), home, or other location. In other examples, power source 371 may be a battery or a device that supplies direct current (DC). In still further examples, computing system 370 and/or power source 371 may receive power from another source. One or more of the devices or components illustrated within computing system 370 may be connected to power source 371, and/or may receive power from power source 371. Power source 371 may have intelligent power management or consumption capabilities, and such features may be controlled, accessed, or adjusted by one or more modules of computing system 370 and/or by one or more processors 373 to intelligently consume, allocate, supply, or otherwise manage power.

One or more processors 373 of computing system 370 may implement functionality and/or execute instructions associated with computing system 370 or associated with one or more modules illustrated herein and/or described below. One or more processors 373 may be, may be part of, and/or may include processing circuitry that performs operations in accordance with one or more aspects of the present disclosure. Examples of processors 373 include microprocessors, application processors, display controllers, auxiliary processors, one or more sensor hubs, and any other hardware configured to function as a processor, a processing unit, or a processing device. Reserve block 360 may use one or more processors 373 to perform operations in accordance with one or more aspects of the present disclosure using software, hardware, firmware, or a mixture of hardware, software, and firmware residing in and/or executing at computing system 370.

One or more communication units 375 of computing system 370 may communicate with devices external to computing system 370 by transmitting and/or receiving data, and may operate, in some respects, as both an input device and an output device. In some examples, communication unit 375 may communicate with other devices over a network. In other examples, communication units 375 may send and/or receive radio signals on a radio network such as a cellular radio network. In other examples, communication units 375 of computing system 370 may transmit and/or receive satellite signals on a satellite network such as a Global Positioning System (GPS) network. Examples of communication units 375 include a network interface card (e.g. such as an Ethernet card), an optical transceiver, a radio frequency transceiver, a GPS receiver, or any other type of device that can send and/or receive information. Other examples of communication units 375 may include devices capable of communicating over Bluetooth®, GPS, NFC, ZigBee, and cellular networks (e.g., 3G, 4G, 5G), and Wi-Fi® radios found in mobile devices as well as Universal Serial Bus (USB) controllers and the like. Such communications may adhere to, implement, or abide by appropriate protocols, including Transmission Control Protocol/Internet Protocol (TCP/IP), Ethernet, Bluetooth, NFC, or other technologies or protocols.

One or more input devices 376 may represent any input devices of computing system 370 through which computing system 370 receives input, including input from other components of reserve block 360, such as reserve bus 314, reserve power source 316, reserve UPS 318, and/or static bypass circuit 320. One or more input devices 376 may generate, receive, and/or process input from any type of device capable of detecting input from a human or machine. For example, one or more input devices 376 may generate, receive, and/or process input in the form of electrical, physical, audio, image, and/or visual input (e.g., peripheral device, keyboard, microphone, camera).

One or more output devices 377 may represent any output devices of computing system 370 through which computing system 370 sends signals, including control signals intended for other components of reserve block 360. Such components may include reserve bus 314, reserve power source 316, reserve UPS 318, and/or static bypass circuit 320. One or more output devices 377 may generate or send information, control signals, and/or output to any type of device capable of detecting input from a human or machine. For example, one or more output devices 377 may generate, receive, and/or process output in the form of electrical and/or physical output (e.g., peripheral device, actuator).

One or more storage devices 380 within computing system 370 may store information for processing during operation of computing system 370. Storage devices 380 may store program instructions and/or data associated with one or more of the modules described in accordance with one or more aspects of this disclosure. One or more processors 373 and one or more storage devices 380 may provide an operating environment or platform for such modules, which may be implemented as software, but may in some examples include any combination of hardware, firmware, and software. One or more processors 373 may execute instructions and one or more storage devices 380 may store instructions and/or data of one or more modules. The combination of processors 373 and storage devices 380 may retrieve, store, and/or execute the instructions and/or data of one or more applications, modules, or software. Processors 373 and/or storage devices 380 may also be operably coupled to one or more other software and/or hardware components, including, but not limited to, one or more of the components of computing system 370 and/or one or more devices or systems illustrated as being connected to computing system 370.

In some examples, one or more storage devices 380 are temporary memories, which may mean that a primary purpose of the one or more storage devices is not long-term storage. Storage devices 380 of computing system 370 may be configured for short-term storage of information as volatile memory and therefore not retain stored contents if deactivated. Examples of volatile memories include random access memories (RAM), dynamic random access memories (DRAM), static random access memories (SRAM), and other forms of volatile memories known in the art. Storage devices 380, in some examples, also include one or more computer-readable storage media. Storage devices 380 may be configured to store larger amounts of information than volatile memory. Storage devices 380 may further be configured for long-term storage of information as non-volatile memory space and retain information after activate/off cycles. Examples of non-volatile memories include magnetic hard disks, optical discs, Flash memories, or forms of electrically programmable memories (EPROM) or electrically erasable and programmable (EEPROM) memories.

Control module 381 may perform functions relating to controlling operation of reserve block 360, including determining when to supply power to one or more primary blocks 304, or whether to cause testing module 382 to initiate or terminate a self-test of other test of reserve block 360 or other components of reserve bus system 300. In some examples, control module 381 may interact with switch 322 (which may be a "normally closed" switch), causing switch 322 to open or close.

Testing module 382 may perform functions relating to initiating a self-test operation of reserve block 360, including determining when to open and/or close switch 322 to initiate or terminate such a test. In some examples, testing module 382 may initiate a self-test, monitor results of the self-test, and evaluate the self-test upon completion. In some examples, testing module 382 may specifically monitor, during a self-test, whether one or more primary blocks 304 have placed a load on reserve bus 314. Testing module 382 may, in cases where a load has been placed on reserve bus 314, cause computing system 370 to terminate any test being conducted.

Modules illustrated in FIG. 3 (e.g., control module 381 and/or testing module 382) and/or illustrated or described elsewhere in this disclosure may perform operations described using software, hardware, firmware, or a mixture of hardware, software, and firmware residing in and/or executing at one or more computing devices. For example, a computing device may execute one or more of such modules with multiple processors or multiple devices. A computing device may execute one or more of such modules as a virtual machine executing on underlying hardware. One or more of such modules may execute as one or more services of an operating system or computing platform. One or more of such modules may execute as one or more executable programs at an application layer of a computing platform. In other examples, functionality provided by a module could be implemented by a dedicated hardware device.

Although certain modules, data stores, components, programs, executables, data items, functional units, and/or other items included within one or more storage devices may be illustrated separately, one or more of such items could be combined and operate as a single module, component, program, executable, data item, or functional unit. For example, one or more modules or data stores may be combined or partially combined so that they operate or provide functionality as a single module. Further, one or more modules may interact with and/or operate in conjunction with one another so that, for example, one module acts as a service or an extension of another module. Also, each module, data store, component, program, executable, data item, functional unit, or other item illustrated within a storage device may include multiple components, sub-components, modules, sub-modules, data stores, and/or other components or modules or data stores not illustrated.

Further, each module, data store, component, program, executable, data item, functional unit, or other item illustrated within a storage device may be implemented in various ways. For example, each module, data store, component, program, executable, data item, functional unit, or other item illustrated within a storage device may be implemented as a downloadable or pre-installed application or "app." In other examples, each module, data store, component, program, executable, data item, functional unit, or other item illustrated within a storage device may be implemented as part of an operating system executed on a computing device.

Figure 4:
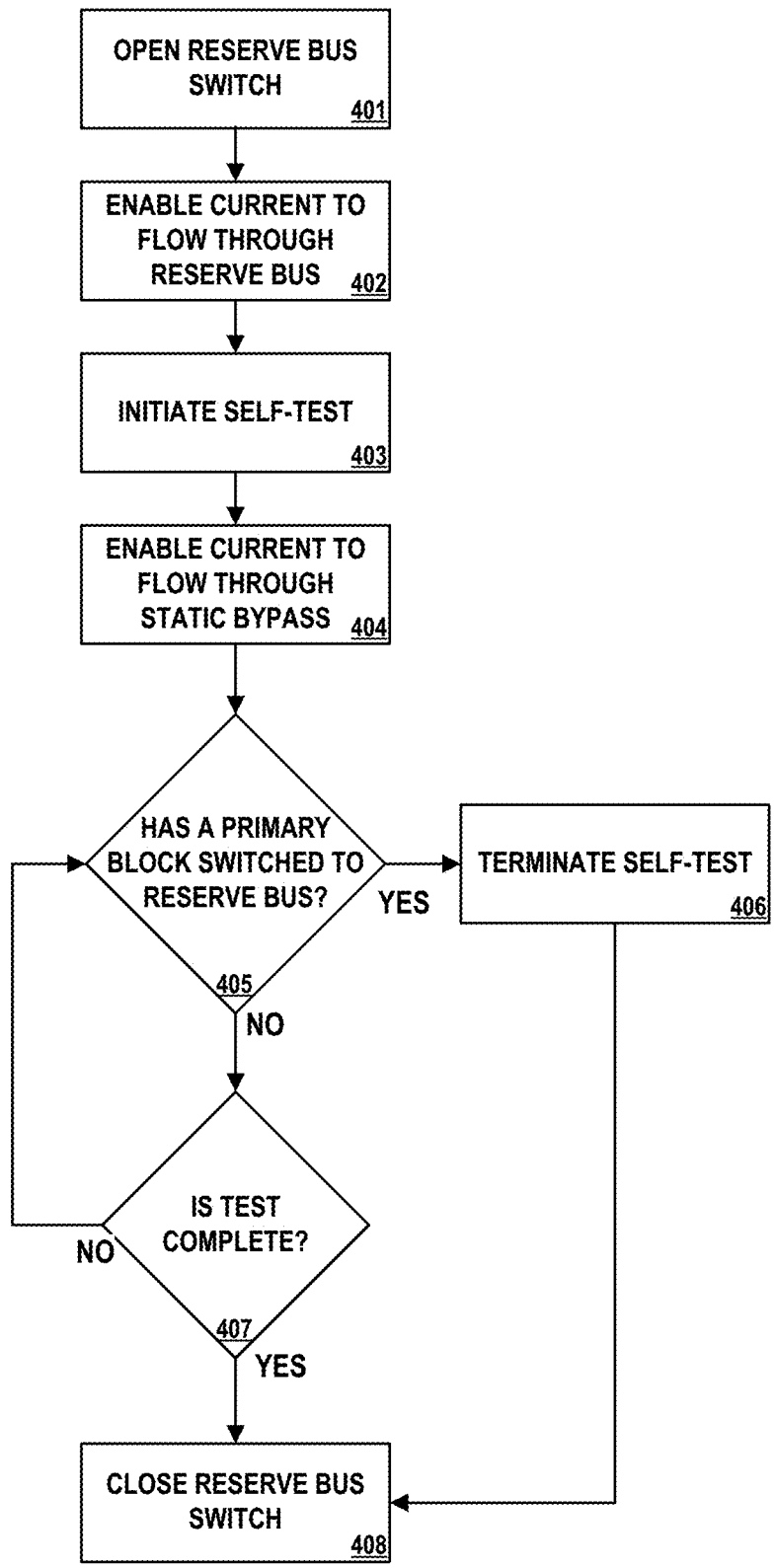
FIG. 4 is a flowchart illustrating a method of load banking a reserve bus in a data center.

FIG. 4 is a flow diagram illustrating operations performed by an example computing system in accordance with one or more aspects of the present disclosure. FIG. 4 is described below within the context of reserve block 360 (including computing system 370) of FIG. 3. In other examples, operations described in FIG. 4 may be performed by one or more other components, modules, systems, or devices. Further, in other examples, operations described in connection with FIG. 4 may be merged, performed in a difference sequence, omitted, or may encompass additional operations not specifically illustrated or described.

In the process illustrated in FIG. 4, and in accordance with one or more aspects of the present disclosure, reserve block 360 may open a reserve bus switch (401). For instance, in an example that can be described with reference to FIG. 3, communication unit 375 of computing system 370 detects a signal over network 305. Communication unit 375 outputs information about the signal to testing module 382. Testing module 382 determines that the signal corresponds to a command, received from client computing device 390 and responsive to input from administrator 391, to initiate a self-test operation for reserve block 360 and reserve bus 314. Testing module 382 causes output device 377 to interact with switch 322 and open switch 322.

Reserve block 360 may enable current to flow through reserve bus 314 (402). For instance, continuing with the example being described, by opening switch 322, computing system 370 enables current to flow from reserve power source 316 through reserve UPS 318 and over reserve bus 314. As illustrated in FIG. 3, current flows within distribution center 302 and over reserve bus 314 passing near each of primary blocks 304 included within distribution center 302.

Reserve block 360 may initiate a self-test (403). For instance, again referring to the example being described, testing module 382 causes output device 377 to output control signals to initiate a test of reserve block 360 and/or reserve bus 314. Once the test is initiated, input device 376 may detect one or more signals. Input device 376 may output information about the signals to testing module 382. Testing module 382 may evaluate the information about the signals and determine whether they indicate proper or improper operation of reserve block 360 and/or reserve bus 314.

In some examples, testing module 382 may evaluate operation of reserve block and/or reserve bus 314 without user input. In other examples, testing module 382 may receive, such as over network 305, information about excessive heat or other indicia of the health of reserve bus 314. Such information may be received in response to field personnel or other user observing and/or measuring conditions of the reserve bus 314. One or more of such users may use a computing device (e.g., client device 390 or similar) to communicate, over network 305, information about reserve bus 314 to computing system 370 and/or testing module 382.

Reserve block 360 may enable current to flow through the static bypass circuit 320 (404). For instance, still referring to FIG. 3, by causing switch 322 to be open, computing system 370 enables current to flow over reserve bus 314 and back through static bypass circuit 320. Reserve UPS 318 within reserve block 360 receives the current flowing back through static bypass circuit 320. Input device 376 may receive information about the current flowing through reserve UPS 318 and may output information about the current to testing module 382. Testing module 382 may evaluate the information about the current and determine whether the information is consistent with proper or improper operation of reserve block 360 and/or reserve bus 314.

Reserve block 360 may determine whether a primary block has switched to reserve bus 314 (405). For instance, again referring to the example being described, input device 376 may detect input while a test is being conducted by testing module 382. Input device 376 may output information about the input to testing module 382. Based on the information, testing module 382 may determine that a load has been placed on reserve bus 314, suggesting that one or more of primary blocks 304 has switched to the reserve bus (YES path from 405). In other examples, testing module 382 may determine that a load has not been placed on reserve bus 314 (NO path from 405).

Reserve block 360 may terminate the self-test (406). For instance, in an example where testing module 382 has determined that a load has been placed on reserve bus 314, testing module 382 outputs information to control module 381. Control module 381 determines that the information from testing module 382 corresponds to a command to terminate the self-test. Control module 381 causes output device 377 to output a signal causing reserve UPS 318 to terminate the self-test.

Reserve block 360 may eventually close switch 322 (408). For instance, in the example where testing module 382 has determined that a load has been placed on reserve bus 314, the signal causing reserve UPS 318 to terminate the self-test may include a signal causing switch 322 to close. In another example, reserve block 360 may eventually finish the self-test without interruption (NO path from 405 and YES path from 407). In such an example, testing module 382 may cause output device 377 to output a signal that results in switch 322 being closed (YES path from 407).

For processes, apparatuses, and other examples or illustrations described herein, including in any flowcharts or flow diagrams, certain operations, acts, steps, or events included in any of the techniques described herein can be performed in a different sequence, may be added, merged, or left out altogether (e.g., not all described acts or events are necessary for the practice of the techniques). Moreover, in certain examples, operations, acts, steps, or events may be performed concurrently, e.g., through multi-threaded processing, interrupt processing, or multiple processors, rather than sequentially. Further certain operations, acts, steps, or events may be performed automatically even if not specifically identified as being performed automatically. Also, certain operations, acts, steps, or events described as being performed automatically may be alternatively not performed automatically, but rather, such operations, acts, steps, or events may be, in some examples, performed in response to input or another event.

For ease of illustration, a limited number of devices (e.g., primary blocks 304, reserve blocks 360, computing systems 370, as well as others) are shown within the Figures and/or in other illustrations referenced herein. However, techniques in accordance with one or more aspects of the present disclosure may be performed with many more of such systems, components, devices, modules, and/or other items, and collective references to such systems, components, devices, modules, and/or other items may represent any number of such systems, components, devices, modules, and/or other items.

The Figures included herein each illustrate at least one example implementation of an aspect of this disclosure. The scope of this disclosure is not, however, limited to such implementations. Accordingly, other example or alternative implementations of systems, methods or techniques described herein, beyond those illustrated in the Figures, may be appropriate in other instances. Such implementations may include a subset of the devices and/or components included in the Figures and/or may include additional devices and/or components not shown in the Figures.

The detailed description set forth above is intended as a description of various configurations and is not intended to represent the only configurations in which the concepts described herein may be practiced. The detailed description includes specific details for the purpose of providing a sufficient understanding of the various concepts. However, these concepts may be practiced without these specific details. In some instances, well-known structures and components are shown in block diagram form in the referenced figures in order to avoid obscuring such concepts.

Accordingly, although one or more implementations of various systems, devices, and/or components may be described with reference to specific Figures, such systems, devices, and/or components may be implemented in a number of different ways. For instance, one or more devices illustrated in the Figures herein as separate devices may alternatively be implemented as a single device; one or more components illustrated as separate components may alternatively be implemented as a single component. Also, in some examples, one or more devices illustrated in the Figures herein as a single device may alternatively be implemented as multiple devices; one or more components illustrated as a single component may alternatively be implemented as multiple components. Each of such multiple devices and/or components may be directly coupled via wired or wireless communication and/or remotely coupled via one or more networks. Also, one or more devices or components that may be illustrated in various Figures herein may alternatively be implemented as part of another device or component not shown in such Figures. In this and other ways, some of the functions described herein may be performed via distributed processing by two or more devices or components.

Further, certain operations, techniques, features, and/or functions may be described herein as being performed by specific components, devices, and/or modules. In other examples, such operations, techniques, features, and/or functions may be performed by different components, devices, or modules. Accordingly, some operations, techniques, features, and/or functions that may be described herein as being attributed to one or more components, devices, or modules may, in other examples, be attributed to other components, devices, and/or modules, even if not specifically described herein in such a manner.

Although specific advantages have been identified in connection with descriptions of some examples, various other examples may include some, none, or all of the enumerated advantages. Other advantages, technical or otherwise, may become apparent to one of ordinary skill in the art from the present disclosure. Further, although specific examples have been disclosed herein, aspects of this disclosure may be implemented using any number of techniques, whether currently known or not, and accordingly, the present disclosure is not limited to the examples specifically described and/or illustrated in this disclosure.

In one or more examples, the functions described may be implemented in hardware, software, firmware, or any combination thereof. If implemented in software, the functions may be stored, as one or more instructions or code, on and/or transmitted over a computer-readable medium and executed by a hardware-based processing unit. Computer-readable media may include computer-readable storage media, which corresponds to a tangible medium such as data storage media, or communication media including any medium that facilitates transfer of a computer program from one place to another (e.g., pursuant to a communication protocol). In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can include RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the terms "processor" or "processing circuitry" as used herein may each refer to any of the foregoing structure or any other structure suitable for implementation of the techniques described. In addition, in some examples, the functionality described may be provided within dedicated hardware and/or software modules. Also, the techniques could be fully implemented in one or more circuits or logic elements.

What is claimed is:

1. A method of testing a distribution center bus system located in a distribution center, wherein the distribution center comprises:
   a primary block configured to provide power to a load, wherein the primary block comprises:
      a primary power source, and
      a primary uninterruptible power supply (UPS) configured with a static transfer switch which switches to another power source should the primary power source become unconditioned; and
   a reserve block configured to serve as the other power source should the primary power source become unconditioned, wherein the reserve block comprises:
      a reserve power source,
      a reserve UPS having a static bypass circuit, wherein the reserve UPS is capable of cycling current through the static bypass circuit without disconnecting the reserve UPS from the reserve power source, and
      a reserve bus capable of connecting the load to the reserve power source;
   wherein the method comprises:
      opening a switch between the reserve UPS and the reserve bus;
      enabling current to flow through the reserve bus;
      initiating a self-test mode at the reserve UPS; and
      enabling the current in the reserve bus to flow through the static bypass circuit, through the reserve UPS, and through the reserve bus to test an integrity of the reserve bus.

2. The method of claim 1, further comprising determining, by the reserve UPS, whether the primary block has switched to the reserve power source.

3. The method of claim 2, further comprising terminating the self-test mode at the reserve UPS in response to determining the primary block has switched to the reserve power source.

4. The method of claim 1, further comprising monitoring, by the reserve UPS, the current in the reserve bus to determine any current loss.

5. The method of claim 1, further comprising monitoring the reserve bus to locate any excessive heat within the reserve bus.

6. The method of claim 1, wherein the primary power source becoming unconditioned includes the primary power source failing to produce power, and wherein the method further comprises:

terminating the self-test mode at the reserve UPS.

7. The method of claim 6, wherein terminating the self-test mode includes closing the switch.

* * * * *